United States Patent
Nagashima

(10) Patent No.: US 8,367,513 B2
(45) Date of Patent: Feb. 5, 2013

(54) SYSTEMS AND METHODS FOR FABRICATING SELF-ALIGNED MEMORY CELL

(75) Inventor: Makoto Nagashima, Tokyo (JP)

(73) Assignee: 4D-S Pty Ltd., Perth (AU)

( * ) Notice: Subject to any disclaimer, the term of this patent is extended or adjusted under 35 U.S.C. 154(b) by 0 days.

(21) Appl. No.: 13/092,830

(22) Filed: Apr. 22, 2011

(65) Prior Publication Data

US 2012/0122290 A1    May 17, 2012

Related U.S. Application Data

(62) Division of application No. 11/486,472, filed on Jul. 14, 2006, now Pat. No. 7,932,548.

(51) Int. Cl.
*H01L 45/00* (2006.01)

(52) U.S. Cl. ........................ 438/382; 257/537

(58) Field of Classification Search ....... 438/3; 257/489, 257/537, E45.003
See application file for complete search history.

(56) References Cited

U.S. PATENT DOCUMENTS

| | | | |
|---|---|---|---|
| 4,021,789 A | 5/1977 | Furman et al. |
| 4,455,742 A | 6/1984 | Williams et al. |
| 4,664,935 A | 5/1987 | Strahl |
| 4,689,770 A | 8/1987 | Miyamoto et al. |
| 4,851,095 A | 7/1989 | Scobey et al. |
| 4,880,515 A | 11/1989 | Yoshikawa et al. |
| 5,000,834 A | 3/1991 | Yoshikawa |
| 5,122,252 A | 6/1992 | Latz et al. |
| 5,135,629 A | 8/1992 | Sawada et al. |
| 5,166,758 A | 11/1992 | Ovshinsky et al. |
| 5,286,296 A | 2/1994 | Sato et al. |
| 5,334,302 A | 8/1994 | Kubo et al. |
| 5,344,352 A | 9/1994 | Horne et al. |
| 5,398,207 A | 3/1995 | Tsuchida et al. |
| 5,415,754 A | 5/1995 | Manley |
| 5,482,329 A | 1/1996 | McCall et al. |
| 5,510,638 A | 4/1996 | Lancaster et al. |
| 5,535,156 A | 7/1996 | Levy et al. |
| 5,656,837 A | 8/1997 | Lancaster et al. |
| 5,666,305 A | 9/1997 | Mihara et al. |
| 5,745,407 A | 4/1998 | Levy et al. |
| 5,981,341 A | 11/1999 | Kim et al. |
| 6,005,807 A | 12/1999 | Chen |
| 6,008,517 A | 12/1999 | Wu |
| 6,015,738 A | 1/2000 | Levy et al. |
| 6,040,597 A | 3/2000 | Kim et al. |
| 6,074,910 A | 6/2000 | Lin |
| 6,077,406 A | 6/2000 | Kawakubo et al. |
| 6,117,756 A | 9/2000 | Wu |
| 6,133,605 A | 10/2000 | Kishi |
| 6,156,172 A | 12/2000 | Kadokura |
| 6,169,686 B1 | 1/2001 | Brug et al. |
| 6,177,315 B1 | 1/2001 | Bergemont et al. |
| 6,204,139 B1 | 3/2001 | Liu et al. |

(Continued)

FOREIGN PATENT DOCUMENTS

WO    2005112118    11/2005

*Primary Examiner* — Thao P. Le
(74) *Attorney, Agent, or Firm* — Sawyer Law Group, P.C.

(57) ABSTRACT

Systems and methods are disclosed to form a resistive random access memory (RRAM) by forming a first metal electrode layer; depositing an insulator above the metal electrode layer and etching the insulator to expose one or more metal portions; depositing a $Pr_{1-x}Ca_xMnO_3$ (PCMO) layer above the insulator and the metal portions, wherein X is between approximately 0.3 and approximately 0.5, to form one or more self-aligned RRAM cells above the first metal electrode; and depositing a second metal electrode layer above the PCMO layer.

20 Claims, 7 Drawing Sheets

U.S. PATENT DOCUMENTS

| | | |
|---|---|---|
| 6,232,185 B1 | 5/2001 | Wang |
| 6,268,247 B1 | 7/2001 | Cremonesi et al. |
| 6,294,431 B1 | 9/2001 | Bez et al. |
| 6,316,316 B1 | 11/2001 | Wu |
| 6,342,133 B2 | 1/2002 | D'Couto et al. |
| 6,385,079 B1 | 5/2002 | Tran |
| 6,392,267 B1 | 5/2002 | Shrivastava et al. |
| 6,473,332 B1 | 10/2002 | Ignatiev et al. |
| 6,497,796 B1 | 12/2002 | Ashtiani et al. |
| 6,501,697 B1 | 12/2002 | Perner et al. |
| 6,525,371 B2 | 2/2003 | Johnson et al. |
| 6,525,953 B1 | 2/2003 | Johnson |
| 6,531,371 B2 | 3/2003 | Hsu et al. |
| 6,555,867 B1 | 4/2003 | Kim |
| 6,569,745 B2 | 5/2003 | Hsu |
| 6,579,760 B1 | 6/2003 | Lung |
| 6,583,003 B1 | 6/2003 | Hsu et al. |
| 6,590,804 B1 | 7/2003 | Perner |
| 6,641,702 B2 | 11/2003 | Shi et al. |
| 6,654,210 B2 | 11/2003 | Pan et al. |
| 6,664,117 B2 | 12/2003 | Zhuang et al. |
| 6,673,691 B2 | 1/2004 | Zhuang et al. |
| 6,674,679 B1 | 1/2004 | Perner et al. |
| 6,689,644 B2 | 2/2004 | Johnson |
| 6,693,821 B2 | 2/2004 | Hsu et al. |
| 6,693,826 B1 | 2/2004 | Black, Jr. et al. |
| 6,723,643 B1 | 4/2004 | Pan et al. |
| 6,746,910 B2 | 6/2004 | Hsu et al. |
| 6,750,101 B2 | 6/2004 | Lung |
| 6,753,561 B1 | 6/2004 | Rinerson et al. |
| 6,754,123 B2 | 6/2004 | Perner et al. |
| 6,759,249 B2 | 7/2004 | Zhuang et al. |
| 6,762,481 B2 | 7/2004 | Liu et al. |
| 6,765,834 B2 | 7/2004 | Perner |
| 6,774,004 B1 | 8/2004 | Hsu et al. |
| 6,774,054 B1 | 8/2004 | Zhang et al. |
| 6,774,429 B2 | 8/2004 | Arai |
| 6,778,421 B2 | 8/2004 | Tran |
| 6,780,683 B2 | 8/2004 | Johnson et al. |
| 6,781,906 B2 | 8/2004 | Perner et al. |
| 6,797,536 B2 | 9/2004 | Yoda et al. |
| 6,798,685 B2 | 9/2004 | Rinerson et al. |
| 6,801,448 B2 | 10/2004 | Hsu |
| 6,804,145 B2 | 10/2004 | Perner |
| 6,808,988 B1 | 10/2004 | Chen et al. |
| 6,815,784 B2 | 11/2004 | Park et al. |
| 6,822,897 B2 | 11/2004 | Ishikawa |
| 6,824,814 B2 | 11/2004 | Zhuang et al. |
| 6,825,058 B2 | 11/2004 | Hsu et al. |
| 6,826,076 B2 | 11/2004 | Asano et al. |
| 6,831,854 B2 | 12/2004 | Rinerson et al. |
| 6,834,008 B2 | 12/2004 | Rinerson et al. |
| 6,836,421 B2 | 12/2004 | Rinerson et al. |
| 6,841,833 B2 | 1/2005 | Hsu et al. |
| 6,849,564 B2 | 2/2005 | Hsu et al. |
| 6,849,891 B1 | 2/2005 | Hsu et al. |
| 6,850,429 B2 | 2/2005 | Rinerson et al. |
| 6,850,455 B2 | 2/2005 | Rinerson et al. |
| 6,856,536 B2 | 2/2005 | Rinerson et al. |
| 6,858,501 B2 | 2/2005 | Hsu |
| 6,858,905 B2 | 2/2005 | Hsu et al. |
| 6,859,382 B2 | 2/2005 | Rinerson et al. |
| 6,861,687 B2 | 3/2005 | Hsu et al. |
| 6,868,025 B2 | 3/2005 | Hsu |
| 6,870,755 B2 | 3/2005 | Rinerson et al. |
| 6,875,651 B2 | 4/2005 | Hsu et al. |
| 6,876,521 B2 | 4/2005 | Pan et al. |
| 6,879,508 B2 | 4/2005 | Tran |
| 6,879,515 B2 | 4/2005 | Yoda et al. |
| 6,881,994 B2 | 4/2005 | Lee et al. |
| 6,887,523 B2 | 5/2005 | Zhuang et al. |
| 6,899,795 B1 | 5/2005 | Dubs et al. |
| 6,902,974 B2 | 6/2005 | Ding |
| 6,905,937 B2 | 6/2005 | Hsu et al. |
| 6,906,939 B2 | 6/2005 | Rinerson et al. |
| 6,909,130 B2 | 6/2005 | Yoda et al. |
| 6,909,628 B2 | 6/2005 | Lin et al. |
| 6,909,632 B2 | 6/2005 | Rinerson et al. |
| 6,911,361 B2 | 6/2005 | Zhang et al. |
| 6,917,539 B2 | 7/2005 | Rinerson et al. |
| 6,922,752 B2 | 7/2005 | Uysal et al. |
| 6,925,001 B2 | 8/2005 | Hsu |
| 6,927,120 B2 | 8/2005 | Hsu et al. |
| 6,927,430 B2 | 8/2005 | Hsu |
| 6,937,505 B2 | 8/2005 | Morikawa |
| 6,939,724 B2 | 9/2005 | Zhuang et al. |
| 6,940,113 B2 | 9/2005 | Hsu et al. |
| 6,940,744 B2 | 9/2005 | Rinerson et al. |
| 6,947,314 B2 | 9/2005 | Yoda et al. |
| 6,949,435 B2 | 9/2005 | Hsu et al. |
| 6,955,992 B2 | 10/2005 | Zhang et al. |
| 6,956,280 B2 | 10/2005 | Tajiri et al. |
| 6,960,815 B2 | 11/2005 | Yoda et al. |
| 6,962,851 B2 | 11/2005 | Ding |
| 6,962,852 B2 | 11/2005 | Ding |
| 6,965,137 B2 | 11/2005 | Kinney et al. |
| 6,967,884 B2 | 11/2005 | Hsu |
| 6,970,375 B2 | 11/2005 | Rinerson et al. |
| 6,972,211 B2 | 12/2005 | Hsu et al. |
| 6,972,238 B2 | 12/2005 | Hsu et al. |
| 6,972,239 B1 | 12/2005 | Li et al. |
| 6,972,985 B2 | 12/2005 | Rinerson et al. |
| 6,977,402 B2 * | 12/2005 | Honma et al. ................ 257/295 |
| 6,985,376 B2 | 1/2006 | Matsuoka |
| 6,992,349 B2 | 1/2006 | Lee et al. |
| 6,992,920 B2 | 1/2006 | Tamai et al. |
| 6,992,922 B2 | 1/2006 | Rinerson |
| 6,995,999 B2 | 2/2006 | Morimoto |
| 6,998,698 B2 | 2/2006 | Inoue et al. |
| 7,001,846 B2 | 2/2006 | Hsu |
| 7,002,199 B2 | 2/2006 | Fukuzumi |
| 7,009,235 B2 * | 3/2006 | Rinerson et al. ............. 257/300 |
| 7,009,273 B2 | 3/2006 | Inoh et al. |
| 7,009,278 B2 | 3/2006 | Hsu |
| 7,009,909 B2 | 3/2006 | Rinerson et al. |
| 7,016,094 B2 | 3/2006 | Awaya et al. |
| 7,016,222 B2 | 3/2006 | Morikawa |
| 7,020,006 B2 | 3/2006 | Chevallier et al. |
| 7,020,012 B2 | 3/2006 | Rinerson et al. |
| 7,027,322 B2 | 4/2006 | Suzuki et al. |
| 7,027,342 B2 | 4/2006 | Inoue |
| 7,029,924 B2 | 4/2006 | Hsu et al. |
| 7,029,982 B1 | 4/2006 | Zhuang et al. |
| 7,038,935 B2 | 5/2006 | Rinerson et al. |
| 7,042,035 B2 | 5/2006 | Rinerson et al. |
| 7,042,066 B2 | 5/2006 | Hsu et al. |
| 7,045,840 B2 | 5/2006 | Tamai et al. |
| 7,054,183 B2 | 5/2006 | Rinerson et al. |
| 7,057,914 B2 | 6/2006 | Rinerson et al. |
| 7,057,922 B2 | 6/2006 | Fukumoto |
| 7,060,586 B2 | 6/2006 | Li et al. |
| 7,063,984 B2 | 6/2006 | Nagashima et al. |
| 7,067,862 B2 | 6/2006 | Rinerson et al. |
| 7,071,008 B2 | 7/2006 | Rinerson et al. |
| 7,075,817 B2 | 7/2006 | Rinerson et al. |
| 7,079,442 B2 | 7/2006 | Rinerson et al. |
| 7,082,052 B2 | 7/2006 | Rinerson et al. |
| 7,084,691 B2 | 8/2006 | Hsu |
| 7,095,643 B2 | 8/2006 | Rinerson et al. |
| 7,095,644 B2 | 8/2006 | Chevallier et al. |
| 7,098,043 B2 | 8/2006 | Zhuang et al. |
| 7,098,101 B1 | 8/2006 | Li et al. |
| 7,099,179 B2 | 8/2006 | Rinerson et al. |
| 7,106,120 B1 | 9/2006 | Hsu |
| 7,169,637 B2 | 1/2007 | Zhang et al. |
| 7,972,239 B2 | 7/2011 | Imediegwu |
| 2001/0013470 A1 | 8/2001 | Hirata et al. |
| 2002/0074225 A1 | 6/2002 | Shi et al. |
| 2003/0001178 A1 | 1/2003 | Hsu et al. |
| 2003/0003674 A1 | 1/2003 | Hsu et al. |
| 2003/0003675 A1 | 1/2003 | Hsu |
| 2003/0142578 A1 | 7/2003 | Hsu et al. |
| 2003/0148545 A1 | 8/2003 | Zhuang et al. |
| 2003/0148546 A1 | 8/2003 | Zhuang et al. |
| 2003/0156445 A1 | 8/2003 | Zhuang et al. |
| 2003/0197587 A1 | 10/2003 | Pan et al. |
| 2003/0203585 A1 | 10/2003 | Hsu |

| | | |
|---|---|---|
| 2003/0206481 A1 | 11/2003 | Hsu et al. |
| 2003/0219534 A1 | 11/2003 | Zhuang et al. |
| 2004/0036109 A1 | 2/2004 | Inoue et al. |
| 2004/0061180 A1 | 4/2004 | Hsu et al. |
| 2004/0063274 A1 | 4/2004 | Hsu et al. |
| 2004/0095689 A1 | 5/2004 | Pan et al. |
| 2004/0095805 A1 | 5/2004 | Matsuoka |
| 2004/0100814 A1 | 5/2004 | Hsu |
| 2004/0108528 A1 | 6/2004 | Hsu et al. |
| 2004/0121074 A1 | 6/2004 | Zhuang et al. |
| 2004/0130939 A1 | 7/2004 | Morikawa |
| 2004/0147081 A1 | 7/2004 | Hsu et al. |
| 2004/0159828 A1 | 8/2004 | Rinerson et al. |
| 2004/0159867 A1 | 8/2004 | Kinney et al. |
| 2004/0159869 A1 | 8/2004 | Rinerson et al. |
| 2004/0160798 A1 | 8/2004 | Rinerson et al. |
| 2004/0160804 A1 | 8/2004 | Rinerson et al. |
| 2004/0160805 A1 | 8/2004 | Rinerson et al. |
| 2004/0160806 A1 | 8/2004 | Rinerson et al. |
| 2004/0160807 A1 | 8/2004 | Rinerson et al. |
| 2004/0160808 A1 | 8/2004 | Rinerson et al. |
| 2004/0160812 A1 | 8/2004 | Rinerson et al. |
| 2004/0160817 A1 | 8/2004 | Rinerson et al. |
| 2004/0160818 A1 | 8/2004 | Rinerson et al. |
| 2004/0160819 A1 | 8/2004 | Rinerson et al. |
| 2004/0161888 A1 | 8/2004 | Rinerson et al. |
| 2004/0164332 A1 | 8/2004 | Hsu et al. |
| 2004/0170040 A1 | 9/2004 | Rinerson et al. |
| 2004/0170048 A1 | 9/2004 | Hsu |
| 2004/0170761 A1 | 9/2004 | Li et al. |
| 2004/0171215 A1 | 9/2004 | Hsu et al. |
| 2004/0179414 A1 | 9/2004 | Hsu |
| 2004/0180507 A1 | 9/2004 | Zhang et al. |
| 2004/0188742 A1 * | 9/2004 | Honma et al. ............... 257/303 |
| 2004/0195604 A1 | 10/2004 | Hwang et al. |
| 2004/0202041 A1 | 10/2004 | Hidenori |
| 2004/0228172 A1 | 11/2004 | Rinerson et al. |
| 2004/0235200 A1 | 11/2004 | Hsu et al. |
| 2004/0235247 A1 | 11/2004 | Hsu et al. |
| 2004/0235309 A1 | 11/2004 | Hsu |
| 2004/0257864 A1 | 12/2004 | Tamai et al. |
| 2004/0264244 A1 | 12/2004 | Morimoto |
| 2005/0009286 A1 | 1/2005 | Hsu et al. |
| 2005/0037520 A1 | 2/2005 | Zhuang et al. |
| 2005/0040482 A1 | 2/2005 | Suzuki et al. |
| 2005/0052942 A1 | 3/2005 | Hsu et al. |
| 2005/0054119 A1 | 3/2005 | Hsu et al. |
| 2005/0054138 A1 | 3/2005 | Hsu et al. |
| 2005/0079727 A1 | 4/2005 | Zhang et al. |
| 2005/0083757 A1 | 4/2005 | Hsu et al. |
| 2005/0101086 A1 * | 5/2005 | Rinerson et al. ............ 438/257 |
| 2005/0111263 A1 | 5/2005 | Rinerson et al. |
| 2005/0122768 A1 | 6/2005 | Fukumoto |
| 2005/0124112 A1 | 6/2005 | Hsu et al. |
| 2005/0127403 A1 | 6/2005 | Hsu |
| 2005/0135147 A1 | 6/2005 | Rinerson et al. |
| 2005/0135148 A1 | 6/2005 | Chevallier et al. |
| 2005/0136602 A1 | 6/2005 | Hsu et al. |
| 2005/0141269 A1 | 6/2005 | Hsu et al. |
| 2005/0145910 A1 | 7/2005 | Tamai et al. |
| 2005/0151277 A1 | 7/2005 | Kawazoe et al. |
| 2005/0152024 A1 | 7/2005 | Awaya et al. |
| 2005/0153504 A1 | 7/2005 | Kawazoe et al. |
| 2005/0158994 A1 | 7/2005 | Zhuang et al. |
| 2005/0169038 A1 | 8/2005 | Inoue et al. |
| 2005/0174835 A1 | 8/2005 | Rinerson et al. |
| 2005/0186334 A1 | 8/2005 | Otabe |
| 2005/0195632 A1 | 9/2005 | Rinerson et al. |
| 2005/0207248 A1 | 9/2005 | Hsu |
| 2005/0207265 A1 | 9/2005 | Hsu et al. |
| 2005/0213368 A1 | 9/2005 | Rinerson et al. |
| 2005/0230724 A1 | 10/2005 | Hsu |
| 2005/0231992 A1 | 10/2005 | Rinerson et al. |
| 2005/0239262 A1 | 10/2005 | Zhuang et al. |
| 2005/0243595 A1 | 11/2005 | Rinerson et al. |
| 2005/0243630 A1 | 11/2005 | Hsu et al. |
| 2005/0245039 A1 | 11/2005 | Li et al. |
| 2005/0266686 A1 | 12/2005 | Zhuang et al. |
| 2005/0270821 A1 | 12/2005 | Nakano |
| 2005/0275003 A1 | 12/2005 | Shinmura |
| 2005/0275064 A1 | 12/2005 | Li et al. |
| 2005/0276091 A1 | 12/2005 | Inoue |
| 2005/0276138 A1 | 12/2005 | Inoue |
| 2006/0002174 A1 | 1/2006 | Hosoi et al. |
| 2006/0003489 A1 | 1/2006 | Zhang et al. |
| 2006/0011897 A1 | 1/2006 | Hsu et al. |
| 2006/0017488 A1 | 1/2006 | Hsu |
| 2006/0018149 A1 | 1/2006 | Rinerson et al. |
| 2006/0023495 A1 | 2/2006 | Rinerson et al. |
| 2006/0023497 A1 | 2/2006 | Kawazoe et al. |
| 2006/0028864 A1 | 2/2006 | Rinerson et al. |
| 2006/0035451 A1 | 2/2006 | Hsu |
| 2006/0067104 A1 | 3/2006 | Hsu |
| 2006/0068099 A1 | 3/2006 | Li et al. |
| 2006/0081961 A1 | 4/2006 | Tanaka et al. |
| 2006/0083055 A1 | 4/2006 | Rinerson et al. |
| 2006/0088974 A1 | 4/2006 | Zhuang et al. |
| 2006/0094187 A1 | 5/2006 | Hsu et al. |
| 2006/0099724 A1 | 5/2006 | Hsu et al. |
| 2006/0099813 A1 | 5/2006 | Pan et al. |
| 2006/0102943 A1 | 5/2006 | Ohnishi et al. |
| 2006/0154417 A1 | 7/2006 | Shinmura et al. |
| 2006/0160304 A1 | 7/2006 | Hsu et al. |
| 2006/0171200 A1 | 8/2006 | Rinerson et al. |
| 2006/0194403 A1 | 8/2006 | Li et al. |
| 2006/0220724 A1 | 10/2006 | Teng Hsu |
| 2007/0048990 A1 | 3/2007 | Zhuang et al. |
| 2007/0120104 A1 | 5/2007 | Ahn et al. |
| 2007/0120124 A1 | 5/2007 | Chen et al. |
| 2007/0132049 A1 | 6/2007 | Stipe |
| 2007/0170413 A1 | 7/2007 | Matsui et al. |
| 2007/0238246 A1 * | 10/2007 | Li et al. ..................... 438/257 |
| 2007/0257300 A1 | 11/2007 | Ho et al. |
| 2008/0014750 A1 | 1/2008 | Nagashima |
| 2009/0102598 A1 | 4/2009 | Yamazaki et al. |

\* cited by examiner

SYSTEMS AND METHODS FOR FABRICATING SELF-ALIGNED MEMORY CELL

CROSS-REFERENCE TO RELATED APPLICATIONS

Under 35 USC §120, this application is a divisional application and claims the benefit of priority to U.S. patent application Ser. No. 11/486,472, filed Jul. 14, 2006, entitled "SYSTEMS AND METHODS FOR FABRICATING SELF-ALIGNED MEMORY CELL", and is related to U.S. patent application Ser. No. 11/388,528, filed Mar. 25, 2006, entitled "SYSTEMS AND METHODS FOR FABRICATING SELF-ALIGNED MEMORY CELL", all of which is incorporated herein by reference.

FIELD OF THE INVENTION

The present invention relates generally to a self-aligned storage' node for a memory device such as a nonvolatile memory device.

BACKGROUND OF THE INVENTION

A memory device such as random access memory (RAM) is a semiconductor device for storing digital information. Data, as digital information, can be written to and read from a RAM. RAMs are fabricated using integrated circuit technology. For example, a DRAM is made of many storage nodes or memory cells and each memory cell has a memory cell transistor and a capacitor. The capacitor is an important element of the memory cell because it stores the digital information. Trench capacitors and stack capacitors are the two major types of DRAM cell capacitors.

DRAMs are volatile and thus require power to maintain the data from being lost. Non-volatile alternatives include resistive random access memory (RRAM) devices, each being a cross point type memory array of a planar matrix of spaced memory cells sandwiched between two meshes of conductors running in orthogonal directions above and below the cells. The row conductors running in one direction are referred to as the word lines, and the column conductors extending in a second direction usually perpendicular to the first direction are referred to as the bit lines. The memory cells are usually arranged in a square or rectangular array so that each memory cell unit is connected with one word line and an intersecting bit line.

In the RRAM array, the resistance of each memory cell has more than one state, and the data in the memory cell is a function of the resistive state of the cell. The resistive memory cells may include one or more magnetic layers, a fuse or anti-fuse, or any element that stores or generates information by affecting the magnitude of the nominal resistance of the element. Other types of resistive elements used in a resistive RAM array include poly-silicon resistors as part of a read-only memory, and floating gate transistors as part of optical memory, imaging devices or floating gate memory devices.

One type of resistive random access memory is a magnetic random access memory (MRAM), in which each memory cell is formed of a plurality of magnetic layers separated by insulating layers. One magnetic layer is called a pinned layer, in which the magnetic orientation is fixed so as not to rotate in the presence of an applied magnetic field in the range of interest. Another magnetic layer is referred to as a sense layer, in which the magnetic orientation is variable between a state aligned with the state of the pinned layer and a state in misalignment with the state of the pinned layer. An insulating tunnel barrier layer sandwiches between the magnetic pinned layer and the magnetic sense layer. This insulating tunnel barrier layer allows quantum mechanical tunneling to occur between the sense layer and the pinned layer. The tunneling is electron spin dependent, causing the resistance of the memory cell, a function of the relative orientations of the magnetizations of the sense layer and the pinned layer. The variations in the junction resistance for the two states of the sense layer determine the data stored in the memory cell. U.S. Pat. No. 6,169,686, granted to Brug et al. on Jan. 2, 2001 discloses such a magnetic memory cell memory. U.S. Pat. No. 6,385,079 discloses a method for designing a resistive random access memory array in which elements are selected with values of resistances that are correlated to maintain a signal-to-noise ratio of 20 decibels or more for the array. A plurality of memory cells are selected and spaced from each other in a matrix of rows and columns, each memory cell being selected to have a junction resistance value of between 0.25 megaohms and 3.60 megaohms. A plurality of conductive row lines are selected and connected between a number N of memory cells in each row, each row and column line being selected to have a row or column unit line resistance value below 0.38 ohms, so that the values of junction resistance are correlated with the values of the row and column unit line resistance to provide a signal-to-noise ratio of 20 decibels or more for the memory array. The values of the row and column unit line resistance are selected so that the total row line resistance for each row is approximately equal to the total column line resistance for each column. The ratio of the junction resistance to the unit line resistance is approximately five million to one, in order to maintain a signal-to-noise ratio of at least 20 decibels in the resistive memory array. For an equal number N of row and column elements, the total row or column line resistance must be greater than approximately five million to N. If N is equal to approximately 1000, the ratio of junction resistance to total row or column line resistance must be approximately 5,000 or greater.

SUMMARY OF THE INVENTION

In one aspect, systems and methods are disclosed to form a resistive random access memory (RRAM) by forming a first metal electrode layer; depositing an insulator above the metal electrode layer and etching the insulator to expose one or more metal portions; depositing a $Pr_{1-X}Ca_XMnO_3$ (PCMO) layer above the insulator and the metal portions, wherein X is between approximately 0.3 and approximately 0.5, to form one or more self-aligned RRAM cells above the first metal electrode; and depositing a second metal electrode layer above the PCMO layer.

In another aspect, a resistive random access memory (RRAM) includes a first metal electrode layer; an insulator material deposited and patterned above the metal electrode layer; a $Pr_{1-X}Ca_XMnO_3$ (PCMO) layer forming one or more self-aligned RRAM cells above the first metal electrode layer, where X is between approximately 0.3 and approximately 0.5; and a second metal electrode layer deposited above the first metal electrode layer.

In yet another aspect, a resistive random access memory (RRAM) includes an insulator material deposited and patterned; and a PCMO layer deposited above the patterned insulator material forming one or more self-aligned RRAM cells without any etching of the PCMO layer.

In another aspect, a resistive random access memory (RRAM) includes an amorphous PCMO or silicon material portion and a polycrystalline PCMO portion adjacent the amorphous material to form one or more self-aligned RRAM cells without any etching thereto.

Implementations of the above aspects may include one or more of the following. The PCMO layer is simply deposited over the insulator to form amorphous PCMO. Where the insulator has been patterned to expose the metal, polycrystalline PCMO forms the RRAM without requiring etching of the PCMO layer. This simplifies the manufacturing process significantly and allows smaller geometry to be achieved. The metal layer can be a transition metal such as chromium, platinum, nickel, ruthenium, copper, and others, a silicide such as nickel silicide, and a Mott insulator such as LNO (LaNi03). As chromium and LNO are "sticky" materials, an adhesion layer is not needed.

In other implementations, an insulator layer can be formed between a wafer and the first metal electrode layer. The first metal electrode layer can be formed above a wafer. Via holes connect the first metal electrode layer to circuit on the wafer. An adhesion layer can be formed above the first metal electrode layer. A metal can be formed above the via holes, and the metal is polished using chemical mechanical polishing. The first or second metal electrode layer can be platinum, chromium, iridium, ruthenium, nickel, silicide, nickel, titanium or LNO. A passivation film can be formed above the second electrode metal layer. Each memory cell can be one of: a two terminal memory device, a three terminal memory device. The PCMO layer can be deposited above the insulator material to form an amorphous PCMO. Alternatively, the PCMO layer can be deposited above the metal openings to form polycrystalline PCMO. A plurality of metal layers and vias can connect the RRAM cells to a wafer circuit. The PCMO layers can be stacked to form a 3-dimensional RAM structure.

Advantages of the invention may include one or more of the following. The system provides a low-cost high density solid state memory device. The memory units can be interconnected within a wafer, and the wafers are interconnected in a stacked wafer construction of a memory system. The resulting semiconductor device offers high density storage at a very low cost. Moreover, the process can be done at low temperature. The substrate temperature in forming a thin film approximately at the range of 300-400 deg. C. and the process requires a short time. Since the thin film is formed at a very low temperature during substantially the whole process, the process can be applied to a highly integrated device to deposit an additional memory layer with a plurality of elements without damaging other elements previously deposited using conventional deposition.

BRIEF DESCRIPTION OF DRAWINGS

In order that the manner in which the above-recited and other advantages and features of the invention are obtained, a more particular description of the invention briefly described above will be rendered by reference to specific embodiments thereof, which are illustrated, in the appended drawings. Understanding that these drawings depict only typical embodiments of the invention and are not therefore to be considered to be limiting of its scope, the invention will be described and explained with additional specificity and detail through the use of the accompanying drawings in which:

FIG. 1C shows an exemplary memory structure with an adhesion layer, while

DETAILED DESCRIPTION OF PREFERRED EMBODIMENTS

Figure 1A:
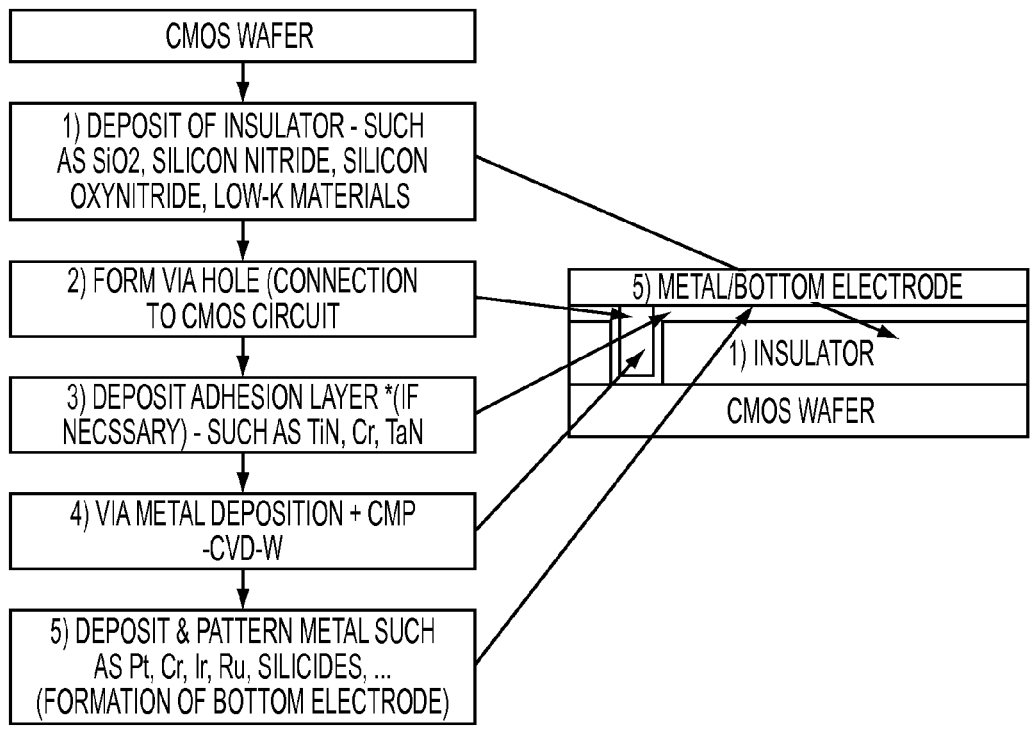
FIGS. 1A-1B show an exemplary process to fabricate a self-aligned memory cell.

Referring now to the drawings in greater detail, there is illustrated therein structure diagrams for a semiconductor processing system and logic flow diagrams for processes a system will utilize to deposit a memory device, as will be more readily understood from a study of the diagrams.

Figure 1B:
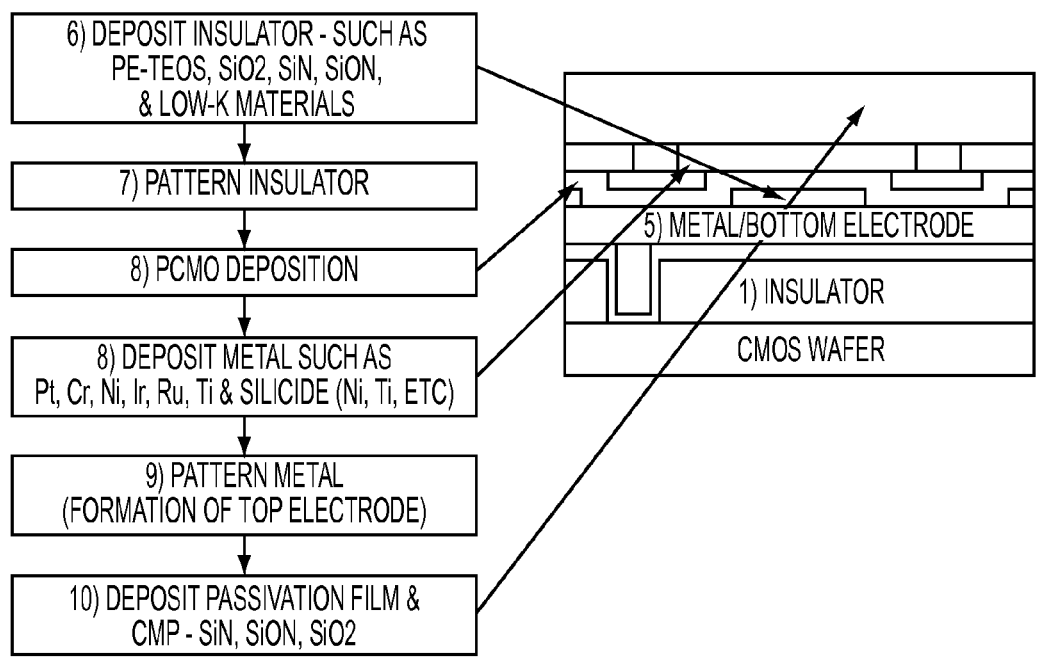

FIGS. 1A-1B show an exemplary process to fabricate a self-aligned memory cell. The process uses CMOS wafers and conventional CMOS circuits or structures may be formed on the wafer prior to the memory cell fabrication. One or more electronic devices can be formed on the wafer. The process forms non-volatile memory such as RRAM. Unlike conventional DRAM, which uses electrical cells (e.g., capacitors) to store data, RRAM uses resistance cells. Because resistance memory cells maintain their state even when power is removed, RRAM possesses a distinct advantage over electrical cells.

Turning now to FIG. 1A, the process deposits an insulator such as silicon dioxide, silicon nitride, silicon oxynitride, or any other suitable low-K materials (1). Next, via holes are formed to provide connections to the CMOS circuits (2). The process then optionally deposits an adhesion layer such as titanium nitride, chromium, or tantalum nitride, among others (3). Next, the process deposits via metal and performs Chemical Mechanical Polishing (CMP) as well as Chemical Vapor Deposition (CVD), among others (4). Next, metal is deposited and patterned to form bottom electrodes using metals such as platinum, chromium, iridium, ruthenium, nickel, or silicides such as nickel or titanium, among others (5).

In FIG. 1B, the process deposits an insulator material such as silicon dioxide, silicon nitride, silicon oxynitride or any suitable low K materials (6). Next, the insulator material is patterned (7). PCMO is then deposited (8). The polycrystalline PCMO is deposited on the metal exposed area and the amorphous PCMO is deposited on the insulator material. A via hole is then formed to connect the PCMO to a top electrode that in turn is connected to a CMOS circuit. Next, metal is deposited and patterned to form top electrodes using metals such as platinum, chromium, iridium, ruthenium, nickel, or silicides such as nickel or titanium, among others (8). The metal is patterned to form a top electrode (9). The process then deposits a passivation film layer such as silicon nitride, silicon oxynitride, or silicon dioxide, among others, and then perform CMP as necessary (10).

The process of FIGS. 1A-1B forms a variable resistor which can be programmed to have high resistance or low resistance (in two-state memory circuits), or any intermediate resistance value (in multi-state memory circuits). The different resistance values of the RRAM cell represent the information stored in the RRAM circuit.

The resulting RRAM is simple and small in size with advantages from the nonvolatile characteristic of the resistor memory cell and the stability of the memory state. Since resistor is a passive component and cannot actively influence nearby electrical components, a basic RRAM cell can be just a variable resistor, arranged in a cross point resistor network to form a cross point memory array. To prevent cross talk or parasitic current path, a RRAM cell can further include a diode, and this combination is sometimes called a 1R1D (or 1D1R) cross point memory cell. To provide better access, a RRAM can include an access transistor, as in DRAM or FRAM cell, and this combination is sometimes called a 1R1T (or 1T1R) cross point memory cell.

The resistance state of a RRAM cell is referred to the storing (writing) or sensing (reading) methodology of the RRAM circuit. The term resistance state is related to the resistance value of the memory resistor (the resistance state can then be said to be the resistance of the memory resistor), but sensing the resistance value of the memory resistor often means sensing the voltage across the memory resistor (the resistance state can then be said to be the voltage across the memory resistor), or sensing the current through the memory resistor (the resistance state then can be said to be the current through the memory resistor). The resistance states of the RRAM can be represented by different techniques such as structural state, polarization, or magnetization.

The PCMO layer is simply deposited over the insulator to form amorphous PCMO which is a typical insulator. Where the insulator has been patterned away to expose the metal layer, the PCMO layer is polycrystalline PCMO which exhibits RRAM capability. The RRAM is formed and does not need etching of PCMO, simplifying the manufacturing process significantly and allowing smaller geometry to be achieved. The metal layer can be a transition metal such as chromium, nickel, ruthenium, copper, or nickel silicide, among others. As chromium is a "sticky" material, an adhesion layer is not needed. If the metal layer is platinum, an adhesive layer may be used to allow other materials to adhere to the platinum layer.

Figure 1C:
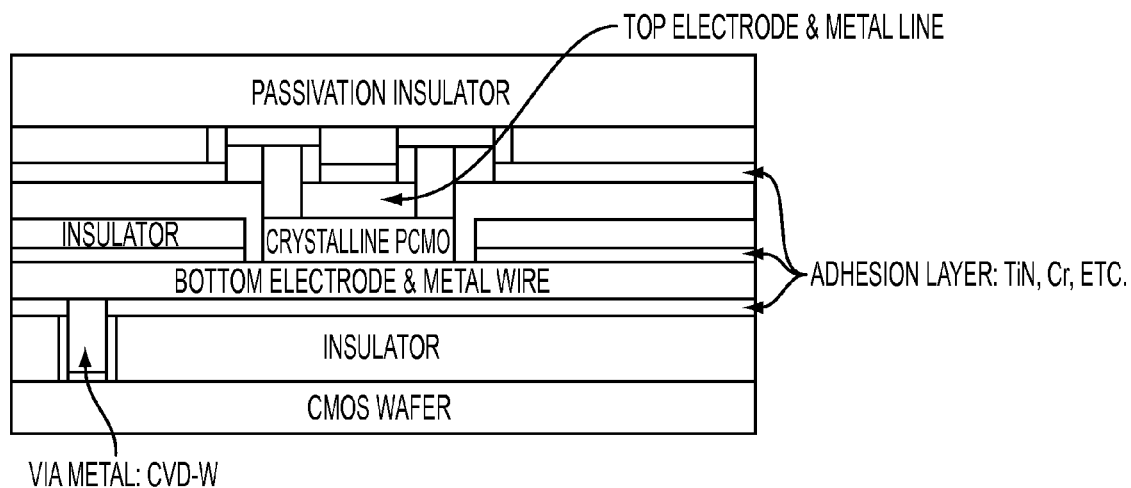

FIG. 10 shows an exemplary memory structure where the metal material such as Pt, Ru, Ir, among others, requires an adhesion layer with an insulator interface. In FIG. 1C, an insulator is formed above a wafer such as a CMOS wafer. The insulator is etched and an adhesion layer such as TiN, TaN or Cr is deposited, resulting in a via with a metal such as CVD W and CMP. Next, a bottom electrode and metal wire is formed. An insulator is deposited and suitably patterned. A PCMO is then deposited. A second adhesion layer of TiN or Cr is then deposited, and a top electrode and metal line is formed. A passivation insulator is then formed to protect the circuitry. FIGS. 1F-1G show exemplary electrical characteristics of the memory device of FIG. 10.

Figure 1D:
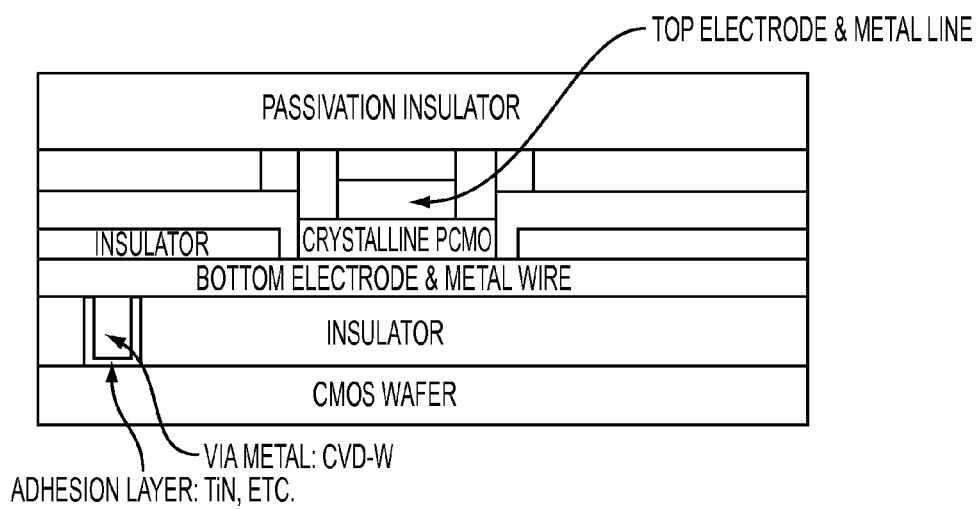
FIG. 1D shows an exemplary memory structure without an adhesion layer.

FIG. 1D shows an exemplary memory structure where the metal material such as Cr, among others, does not need an adhesion layer with an insulator interface. Similar to FIG. 10, an insulator is formed above a wafer such as a CMOS wafer. The insulator is etched and an adhesion layer such as TiN or Cr is deposited in a via with a metal such as CVD W and CMP. Next, a bottom electrode and metal wire is formed. An insulator is deposited and patterned. Then a PCMO layer is deposited. Where the PCMO is deposited above the insulator, an amorphous PCMO is formed. Where the PCMO is deposited to exposed metal surface, a polycrystalline PCMO is formed. A top electrode and metal line is formed, and a passivation insulator is then formed to protect the circuitry.

Figure 1E:
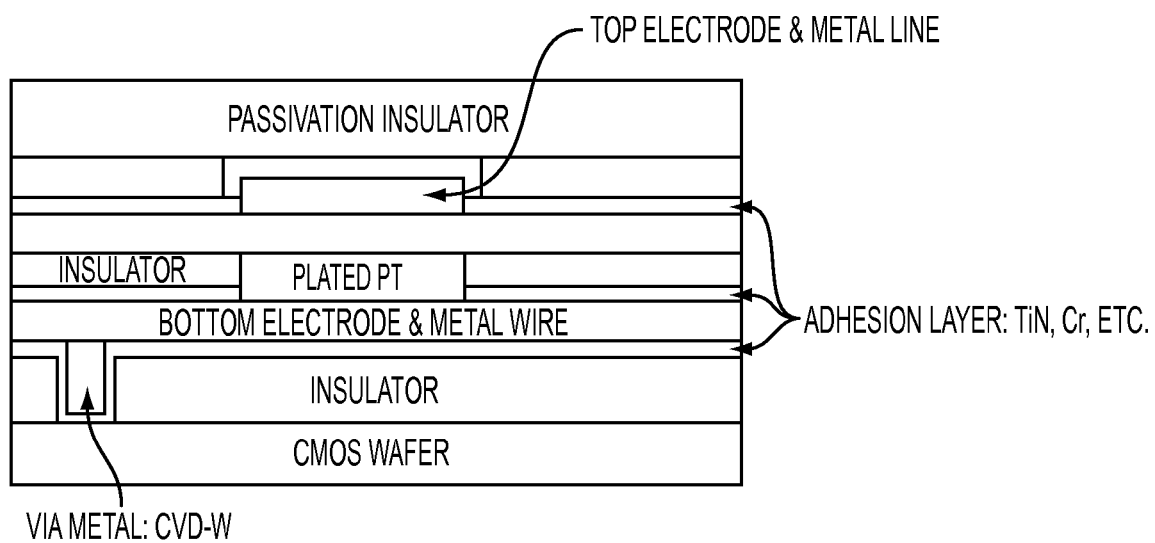
FIG. 1E shows an exemplary memory structure with platinum plating.

FIG. 1E shows an exemplary cross sectional view of an exemplary PCMO memory. In FIG. 1E, the selective-plating with platinum (Pt) forms the bottom electrode on the metal wire. The crystalline PCMO grows on a platinum surface and no crystalline PCMO was grown on insulators such as SiO2 and SiN, among others. The metal layer can be aluminum, tungsten, chromium, nickel or copper, or a suitable metal. The metal can also be a noble metal such as Pt or In, but these materials are difficult to work with. The insulator can be SiN, SiON, SiO2 or other insulators.

Figure 2:
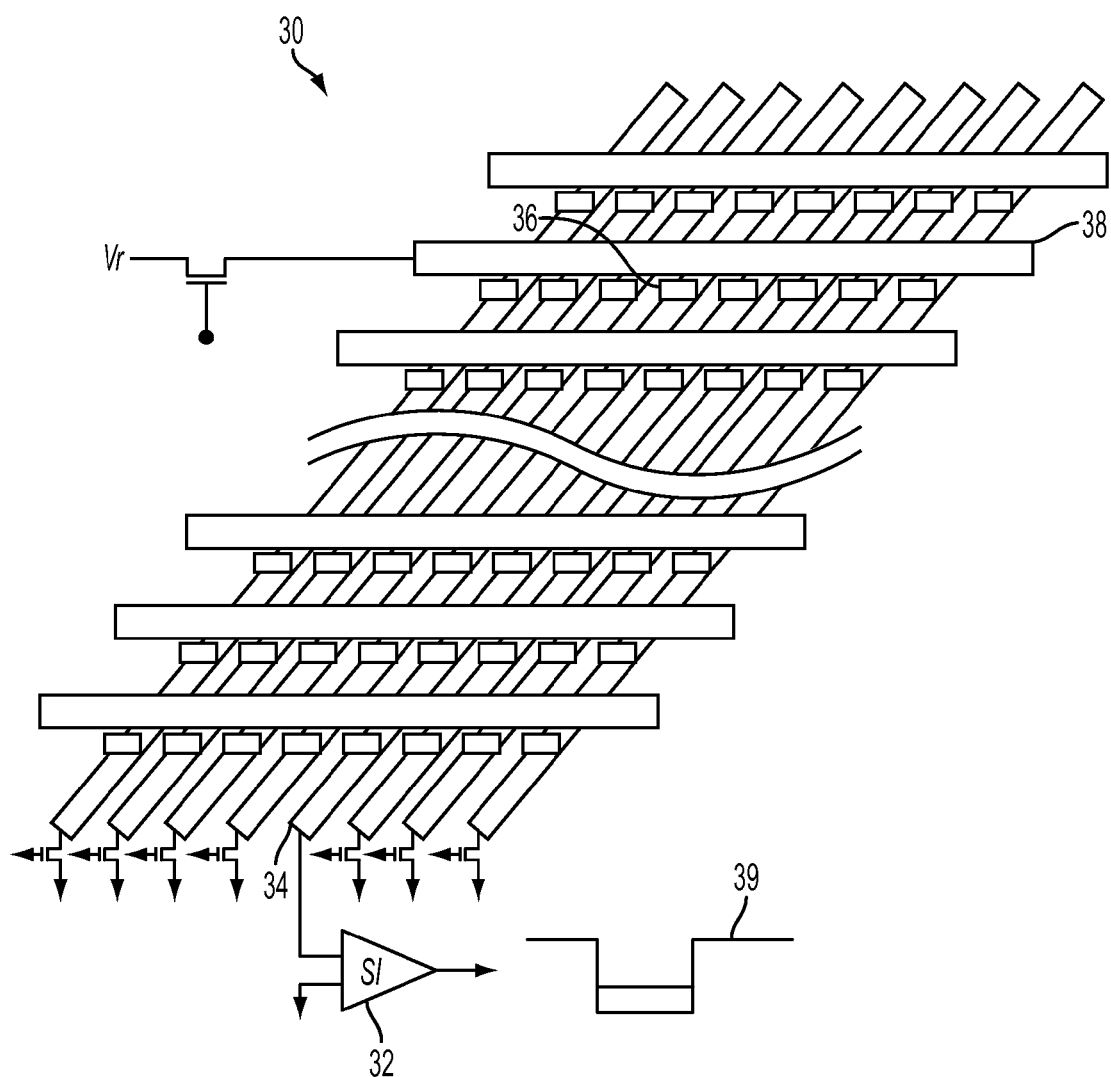
FIG. 2 shows a first exemplary RRAM memory array with two-terminal memory cells.

Referring to FIG. 2, a first exemplary RRAM memory array 30 with two-terminal memory cells is shown. A sense amplifier 32 is connected to the bit line 34 of a selected memory cell 36. Each cell 36 has logic states "1" and "0" that correspond to a low resistance state and a high resistance state, respectively. The cell 36 can also have multiple states, enabling multiple states such as 256 states to be stored in one cell, resulting in high density storage cells. The resistance of a selected memory cell 36 may be changed by applying currents to a word line 12 and a bit line 14 crossing the selected memory cell. A voltage Vr is applied to the word line 38 of the selected memory cell 36, and sense amplifier 32 applies a voltage to the bit line 34 of cell 36. The sense amplifier 32 provides an amplified output 39 reflecting the state of the memory cell 36. The same bit line voltage is applied to all of the bit line 34, effectively biasing all the cells on unselected rows to zero potential. This action isolates the bit line currents from one another, effectively blocking most of the leakage current that might otherwise flow through secondary paths where such leakage may possibly cause errors in the sensing function of the selected memory cell.

Figure 3:
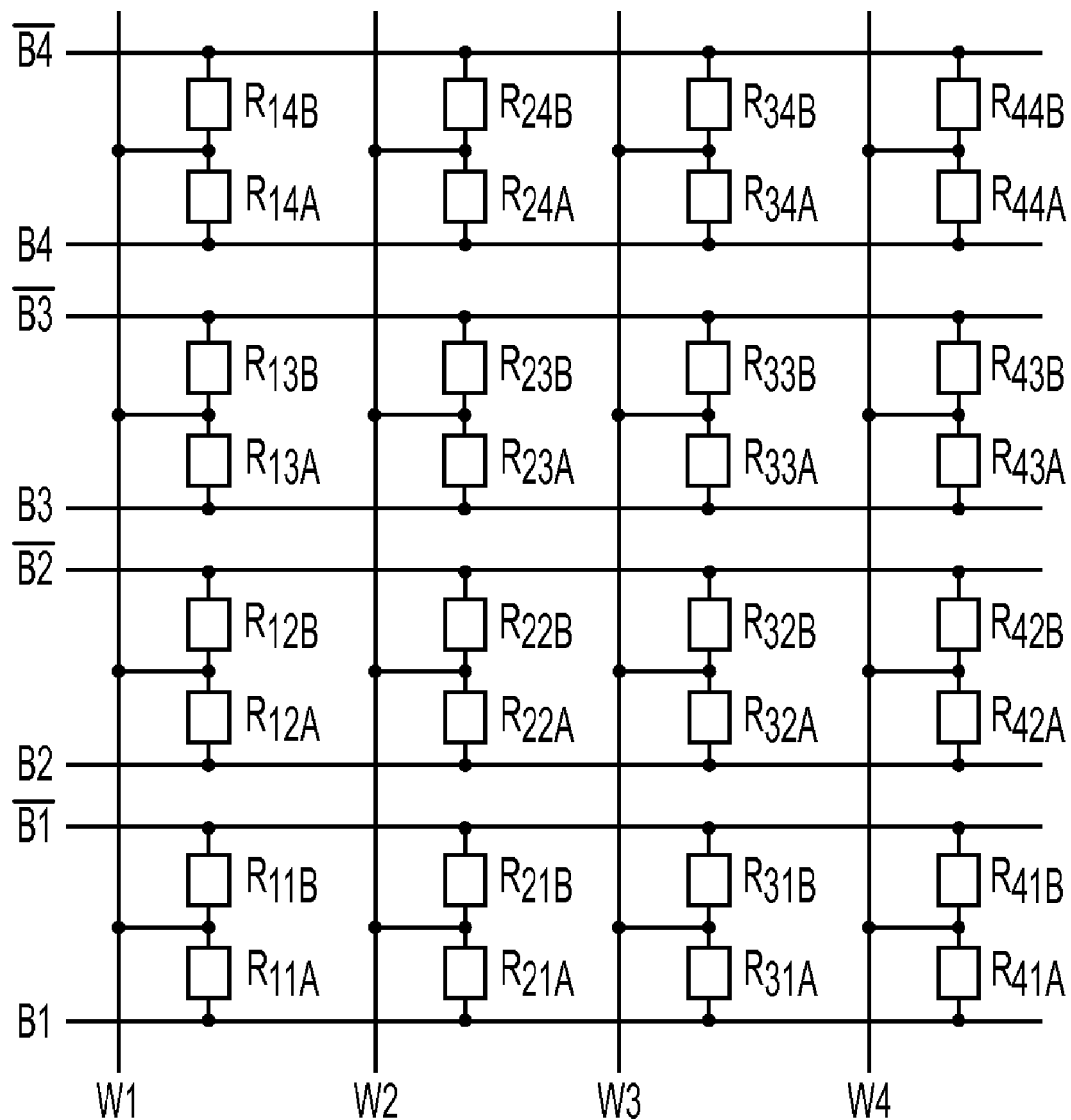
FIG. 3 depicts a second exemplary RRAM array with a complementary output (three terminal memory cell).

FIG. 3 depicts a second exemplary RRAM array with a complementary output (three terminal memory cell). Each memory cell consists of two memory resistors formed in accordance with FIGS. 1A-1B. Each of the complementary bit lines is connected to the respect input of a differential amplifier, which was not shown in this figure. The output of the differential amplifier may be connected to an inverter for a digital output at either "0" or "1" state. The RRAM thin film can have a uniform material property, in which case the RRAM can be programmed in one step. Alternatively, for high density or for processes that do not provide uniform thin film deposition, a two-step programming may be applied to any non-uniform property RRAM thin film memory cell.

The-one-step programming process will be discussed first. The selected cell is W2B2 and a first related bit line, B22, will be programmed to high voltage bit and a second related bit line, B22, will be programmed to low voltage bit. The word line, W2 is floated. All other word lines are biased with half-programming pulse voltage. Bit line B22 is grounded. Programming pulse, VP is applied to B22. All other bit lines are biased to the ground potential. As a result the resistor R22A is at the low resistance-state and the resistance B22B is at the high resistance-state. All memory resistor in the bit 2 other than that connected to W2 word lines are biased with half of the programming voltage. Therefore, there is no resistance change. Similarly each bit lines along the W2 may be properly biased to program one word at a time. After programming, the two memory cell resistors in any given bit are at the high resistance-state and low resistance-state, respectively.

The two-step programming is more conventional. Again, cell W2B2 is selected in this example. A first selected memory resistor, R22A and memory resistor R22B are programmed to a low resistance state and to a high resistance-state, respectively. The selected word line, W2, is set to ground potential, and all other word lines are biased to 0.5 VP. A negative programming pulse, having pulse amplitude of −VP, and a positive programming pulse, having amplitude of +VP, with appropriate pulse widths, are applied to bit lines B2 and !B2, respectively. The positive and the negative programming pulses do not have to be applied simultaneously, and the A resistor and the B resistor may be programmed separately.

Memory resistors, R22A and R22B, are, therefore, programmed to a low resistance state, RL and a high resistance state, RH, respectively. All other memory resistors are either pulsed with half of the programming pulse voltage, or not pulsed. Therefore, the resistance of the non-selected memory resistors will not change during this programming operation.

The memory array may be read by applying a read voltage to the word line and detecting (reading) the voltage difference between the bit lines which share the memory cell.

Figure 4:
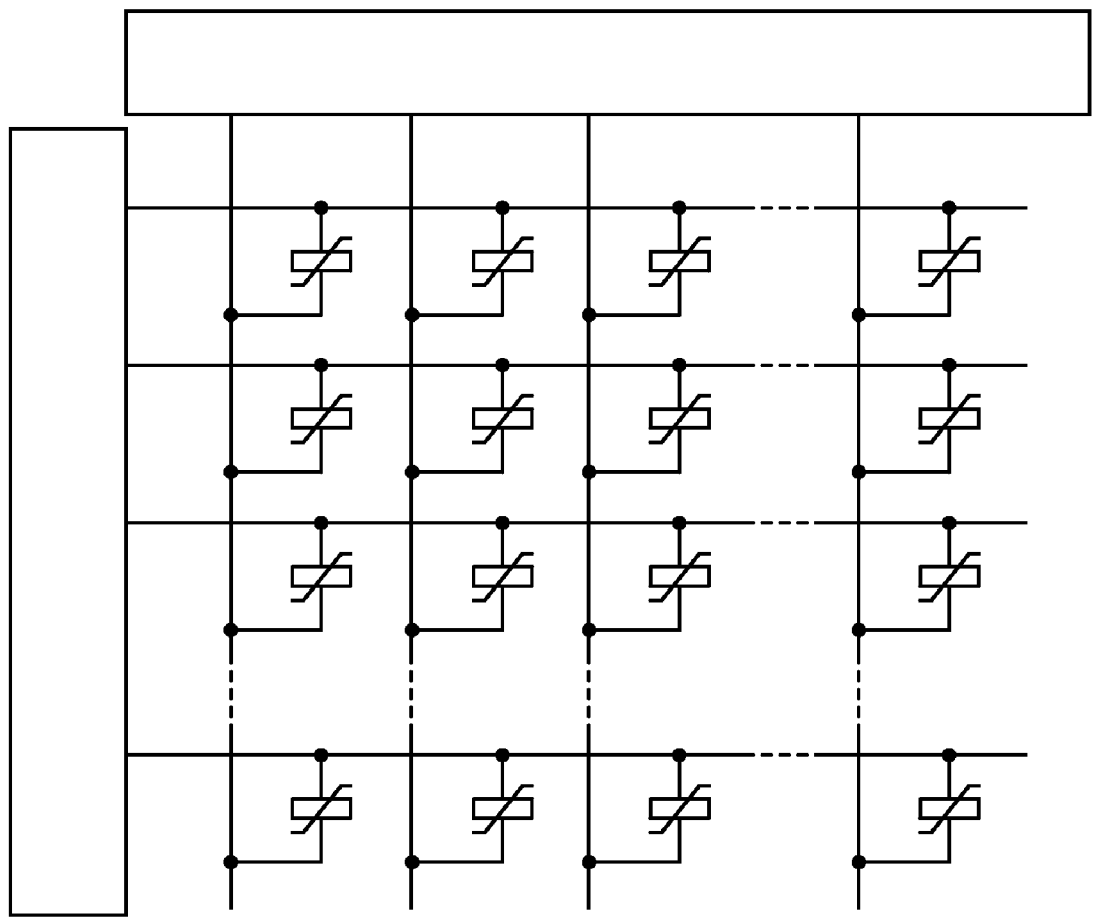
FIG. 4 shows an exemplary RRAM array.

In one exemplary memory cell array shown in FIG. 4, word lines for selecting rows and bit lines for selecting columns are arranged to intersect at right angles. Memory cells are formed at intersections, and a peripheral driver circuit for selectively allowing information to be written into or read from the memory cells and an amplifier circuit which for reading the information are also formed. The peripheral circuit section includes a word line driver circuit and bit line driver circuit and a signal detecting circuit such as a sense amplifier, for example.

Figure 5:
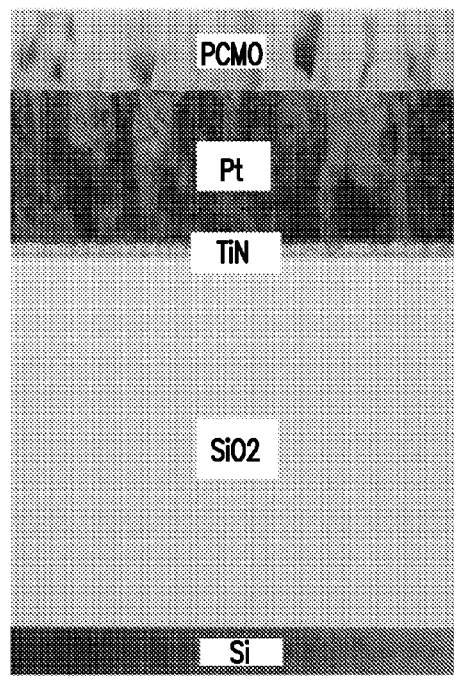
FIG. 5 shows a cross sectional TEM view of an exemplary PCMO RRAM Memory Cell.

FIG. 5 shows a cross sectional TEM view of an exemplary PCMO RRAM memory cell. IN this RRAM embodiment, the memory device is formed of silicon (Si), silicon oxide (SiO2), titanium nitride (TiN), platinum (Pt), and PCMO material, respectively.

Figure 6:
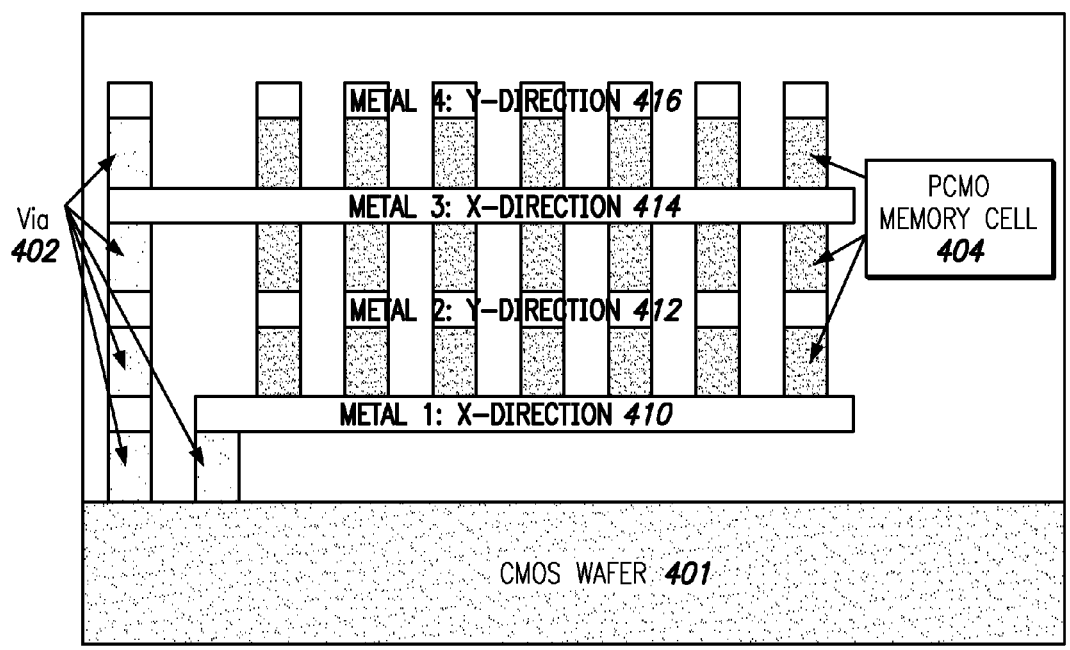
FIG. 6 shows an exemplary multi-level RRAM.

FIG. 6 shows an exemplary multi-level RRAM. In FIG. 6, vias 402 enable connections to be made from a wafer 401 to a plurality of metal lines 410-416 along the X and Y axis to select and access a plurality of RRAM cells 404 formed above the wafer 401.

It is to be understood that various terms employed in the description herein are interchangeable. Accordingly, the above description of the invention is illustrative and not limiting. Further modifications will be apparent to one of ordinary skill in the art in light of this disclosure.

What is claimed is:

1. A method to form a resistive random access memory (RRAM), comprising:
   a. forming a first metal electrode layer;
   b. depositing an insulator above the metal electrode layer and etching the insulator to expose one or more metal portions;
   c. depositing a $Pr_{1-X}Ca_XMnO_3$ (PCMO) layer above the insulator and the metal portions, wherein X is between approximately 0.3 and approximately 0.5;
   d. forming one or more self-aligned RRAM cells above the first metal electrode; and
   e. depositing a second metal electrode layer above the PCMO layer.

2. The method of claim 1, comprising depositing and patterning an insulator layer between a wafer and the first metal electrode layer.

3. The method of claim 1, wherein the first metal electrode layer is formed above a wafer.

4. The method of claim 3, comprising forming via holes to connect the first metal electrode layer to circuit on the wafer.

5. The method of claim 4, comprising depositing metal above the via holes.

6. The method of claim 3, comprising depositing an adhesion layer above the first metal electrode layer.

7. The method of claim 5, comprising performing chemical mechanical polishing on the first metal electrode layer.

8. The method of claim 1, wherein the first metal electrode layer comprises one of: platinum, chromium, iridium, ruthenium, nickel, silicides, nickel, titanium.

9. The method of claim 1, comprising depositing a passivation film.

10. The method of claim 9, comprising performing chemical mechanical polishing on the passivated film.

11. The method of claim 1, wherein the forming of the first metal electrode comprises selective plating.

12. A method to form a resistive random access memory (RRAM) array, comprising:
   a. forming a first metal electrode layer;
   b. depositing an insulator above the metal electrode layer and etching the insulator to expose one or more metal portions;
   c. depositing a $Pr_{1-X}Ca_XMnO_3$ (PCMO) layer above the insulator and the metal portions;
   d. forming one or more self-aligned RRAM cells above the first metal electrode; and
   e. depositing a second metal electrode layer above the PCMO layer.

13. The method of claim 12, comprising forming one or more via holes to connect the first metal electrode layer to a circuit on the wafer.

14. The method of claim 13, comprising depositing metal above the via holes.

15. The method of claim 14, comprising performing chemical mechanical polishing on the first metal electrode layer.

16. The method of claim 12, wherein the forming of the first metal electrode comprises selective plating.

17. A method to form an electronic device comprising a resistive random access memory (RRAM) array, comprising:
   a. forming a first metal electrode layer;
   b. depositing an insulator above the metal electrode layer and etching the insulator to expose one or more metal portions;
   c. depositing a $Pr_{1-X}Ca_XMnO_3$ (PCMO) layer above the insulator and the metal portions;
   d. forming one or more self-aligned RRAM cells above the first metal electrode; and
   e. depositing a second metal electrode layer above the PCMO layer.

18. The method of claim 17, comprising forming one or more via holes to connect the first metal electrode layer to a circuit on the wafer.

19. The method of claim 17, comprising depositing metal above the via holes.

20. The method of claim 17, comprising performing chemical mechanical polishing on the first metal electrode layer.

* * * * *